US010665477B2

(12) United States Patent
Kim

(10) Patent No.: US 10,665,477 B2
(45) Date of Patent: May 26, 2020

(54) SUBSTRATE CLEANING APPARATUS AND SUBSTRATE PROCESSING FACILITY HAVING THE SAME

(71) Applicant: SAMSUNG ELECTRONICS CO., LTD., Suwon-si, Gyeonggi-do (KR)

(72) Inventor: Tea-Geon Kim, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 522 days.

(21) Appl. No.: 15/392,008

(22) Filed: Dec. 28, 2016

(65) Prior Publication Data

US 2017/0250095 A1 Aug. 31, 2017

(30) Foreign Application Priority Data

Feb. 26, 2016 (KR) .................... 10-2016-0023246

(51) Int. Cl.
| | |
|---|---|
| *H01L 21/67* | (2006.01) |
| *B08B 1/02* | (2006.01) |
| *B08B 3/14* | (2006.01) |
| *B08B 3/12* | (2006.01) |
| *B08B 3/04* | (2006.01) |
| *B08B 1/00* | (2006.01) |
| *B08B 1/04* | (2006.01) |
| *B08B 3/10* | (2006.01) |
| *B08B 3/00* | (2006.01) |

(52) U.S. Cl.
CPC ........ *H01L 21/67046* (2013.01); *B08B 1/001* (2013.01); *B08B 1/007* (2013.01); *B08B 1/04* (2013.01); *B08B 3/00* (2013.01); *B08B 3/102* (2013.01); *B08B 3/12* (2013.01); *H01L 21/67034* (2013.01)

(58) Field of Classification Search
CPC .......... H02K 3/40; H02K 3/14; Y10S 174/13; H01L 21/6704; H01L 21/67034; B08B 1/001; B08B 1/007; B08B 1/04; B08B 3/00; B08B 3/102; B08B 3/12
See application file for complete search history.

(56) References Cited

U.S. PATENT DOCUMENTS

| | | | | |
|---|---|---|---|---|
| 6,257,966 B1* | 7/2001 | Ishikawa | ............... | B24B 37/345 451/279 |
| 6,406,359 B1* | 6/2002 | Birang | .................. | B24B 37/345 451/339 |
| 6,413,145 B1* | 7/2002 | Pinson, II | ......... | H01L 21/67161 451/21 |
| 6,488,565 B1* | 12/2002 | White | ................. | B24B 27/0076 451/285 |

(Continued)

FOREIGN PATENT DOCUMENTS

| | | |
|---|---|---|
| JP | 2013-065603 A | 4/2013 |
| KR | 10-2007-0074727 A | 7/2007 |

(Continued)

*Primary Examiner* — Benjamin L Osterhout
(74) *Attorney, Agent, or Firm* — Lee IP Law, P.C.

(57) ABSTRACT

A substrate cleaning apparatus includes a porous suction part having a polygonal pillar shape with a plurality of cleaning surfaces, a transfer unit to transfer a substrate with a plurality of semiconductor devices toward the porous suction part, and to contact the semiconductor devices with one of the plurality of cleaning surfaces, and a rotation driving part to rotate the porous suction part.

20 Claims, 16 Drawing Sheets

(56) References Cited

U.S. PATENT DOCUMENTS

| | | | |
|---|---|---|---|
| 6,494,197 | B1 | 12/2002 | Yoshimura et al. |
| 6,805,616 | B2 * | 10/2004 | Kawashima .......... B24B 37/345 |
| | | | 451/289 |
| 2004/0076753 | A1 * | 4/2004 | Sousa ...................... B05D 1/18 |
| | | | 427/322 |
| 2007/0054443 | A1 * | 3/2007 | Shimomura ......... B23K 26/067 |
| | | | 438/149 |
| 2009/0242524 | A1 | 10/2009 | Amakawa |
| 2012/0255488 | A1 * | 10/2012 | Rebstock .............. B05C 1/0808 |
| | | | 118/255 |
| 2014/0170835 | A1 | 6/2014 | Tamboli et al. |
| 2015/0306644 | A1 | 10/2015 | Yoshida et al. |

FOREIGN PATENT DOCUMENTS

| | | |
|---|---|---|
| KR | 10-2008-0047976 A | 5/2008 |
| KR | 10-1281495 B1 | 7/2013 |

\* cited by examiner

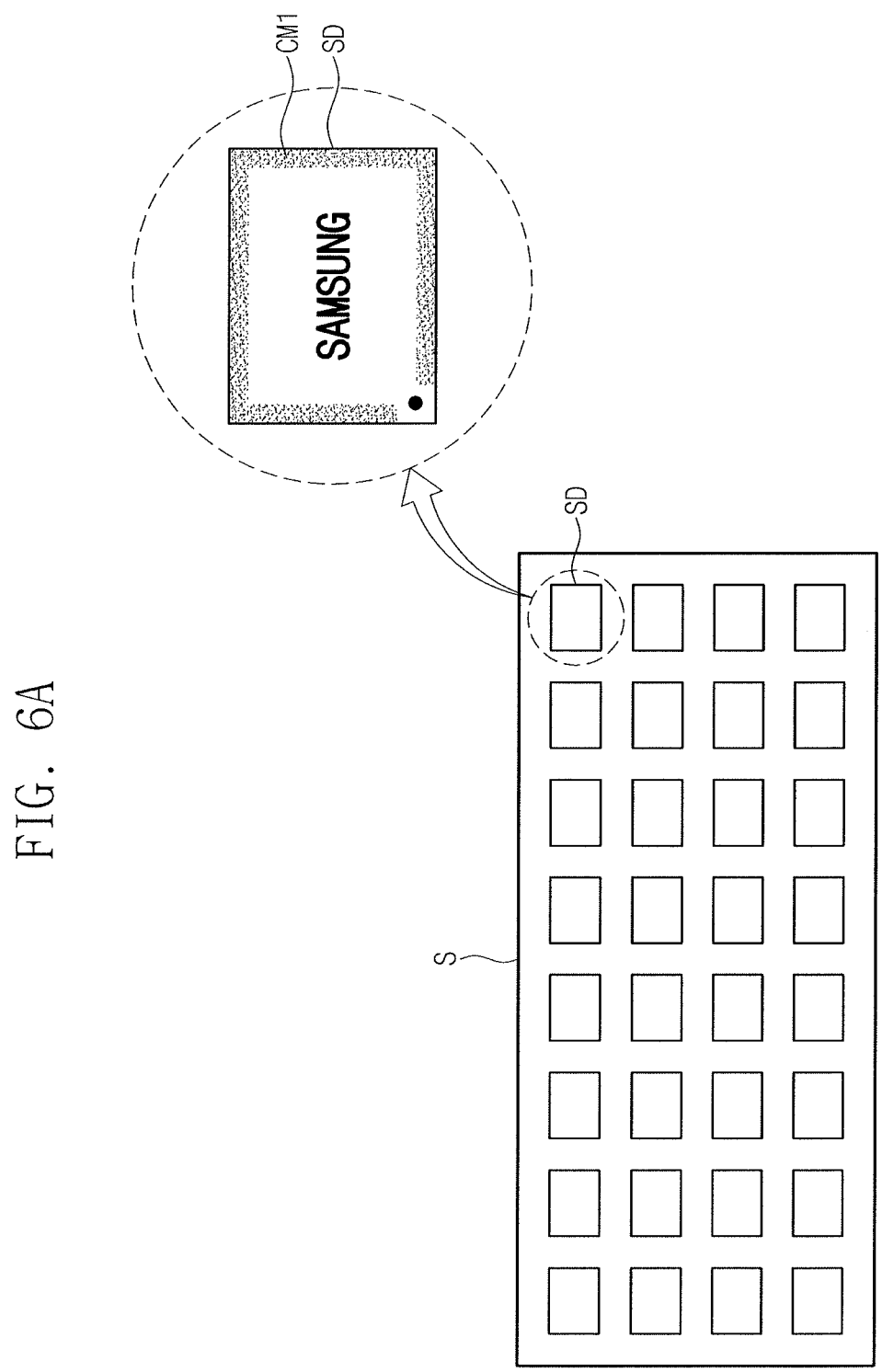

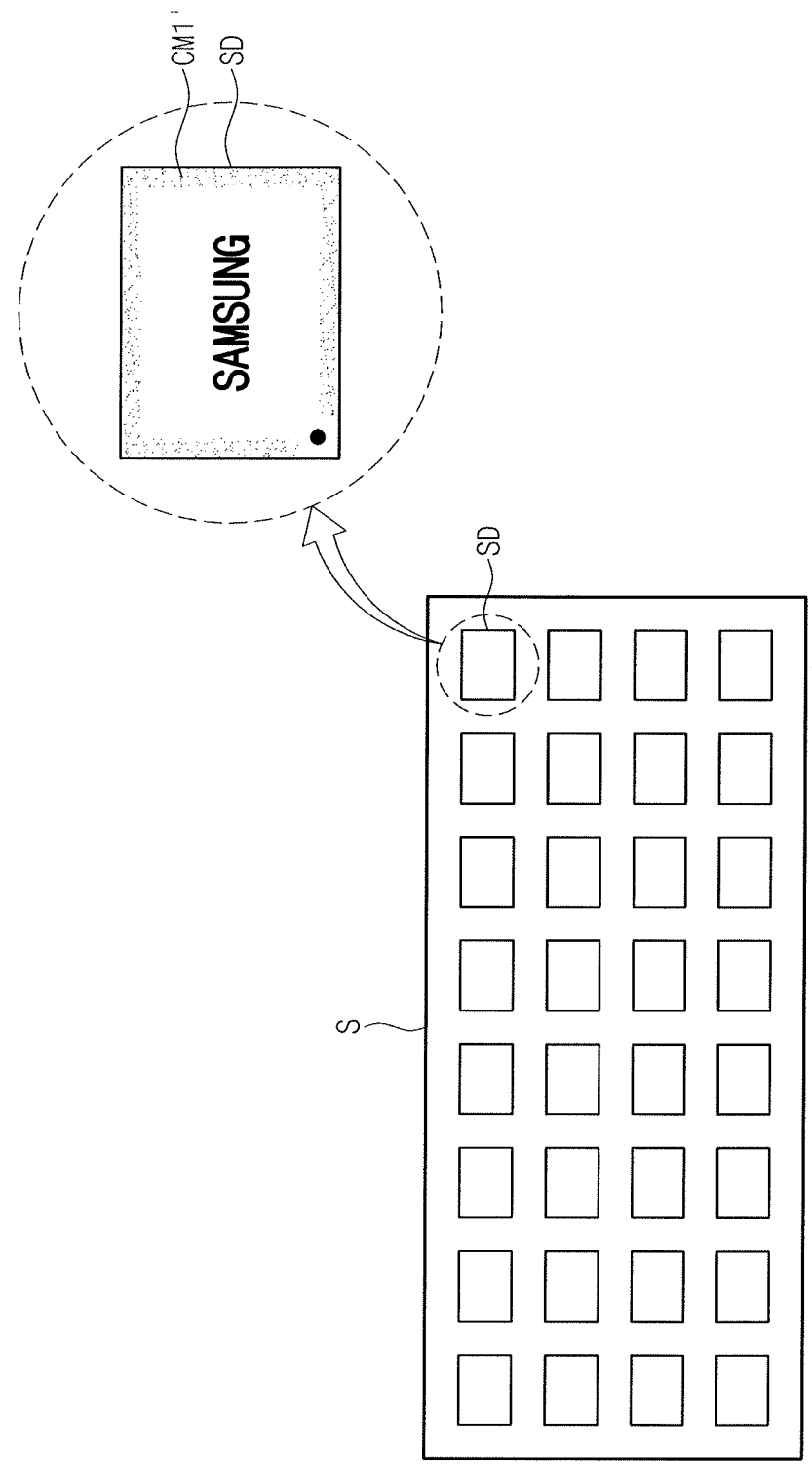

SUBSTRATE CLEANING APPARATUS AND SUBSTRATE PROCESSING FACILITY HAVING THE SAME

CROSS-REFERENCE TO RELATED APPLICATION

Korean Patent Application No. 10-2016-0023246, filed on Feb. 26, 2016, in the Korean Intellectual Property Office, and entitled: "Substrate Cleaning Apparatus and Substrate Processing Facility Having the Same," is incorporated by reference herein in its entirety.

BACKGROUND

1. Field

The present disclosure relates to a substrate cleaning apparatus and a substrate processing facility having the same.

2. Description of the Related Art

A semiconductor device may be fabricated by various processes, e.g., deposition, photolithography, etching, and sawing. After each of the processes is completed, a cleaning process may be performed to remove unnecessary layers, contaminants, particles, etc. In general, the cleaning process may include a chemical process for removing foreign substances by providing a chemical, e.g., a hydrofluoric acid, a sulfuric acid and/or nitric acid, a washing process for removing the chemical remaining on a substrate by providing a washing solution, e.g., deionized water, and a drying process for removing the washing solution remaining on the substrate.

SUMMARY

Embodiments provide a substrate cleaning apparatus and a substrate processing facility having the same capable of removing contaminants from semiconductor devices.

Embodiments also provide a substrate cleaning apparatus and a substrate processing facility having the same suitable for increasing the lifetime of a porous suction part which is used to remove contaminants from semiconductor devices.

According to exemplary embodiments, a substrate cleaning apparatus may include a porous suction part having a polygonal pillar shape with a plurality of cleaning surfaces, a transfer unit that transfer a substrate including a plurality of semiconductor devices toward the porous suction part and makes the semiconductor devices in contact with one of the cleaning surfaces, and a rotation driving part that rotates the porous suction part.

According to exemplary embodiments, a substrate processing facility may include a substrate cleaning apparatus configured to remove contaminants of semiconductor devices on a substrate, and a drying apparatus configured to dry the substrate that has passed through the substrate cleaning substrate. The substrate cleaning apparatus may include a porous suction part having a polygonal pillar shape with a plurality of cleaning surfaces, a transfer unit that transfers the substrate toward the porous suction part and makes the semiconductor devices in contact with one of the cleaning surfaces, and a rotation driving part that rotates the porous suction part.

According to exemplary embodiments, a substrate cleaning apparatus may include a rotatable porous pillar having a polygonal shape with a plurality of cleaning surfaces, and a transfer unit to contact semiconductor devices on a substrate with one or more of the plurality of cleaning surfaces during rotation of the porous pillar.

BRIEF DESCRIPTION OF THE DRAWINGS

Features will become apparent to those of ordinary skill in the art by describing in detail exemplary embodiments with reference to the attached drawings, in which:

FIGS. 6A to 6C illustrate plan views of changing shape of a substrate processed by the substrate processing facility of FIG. 1;

DETAILED DESCRIPTION

Figure 1:
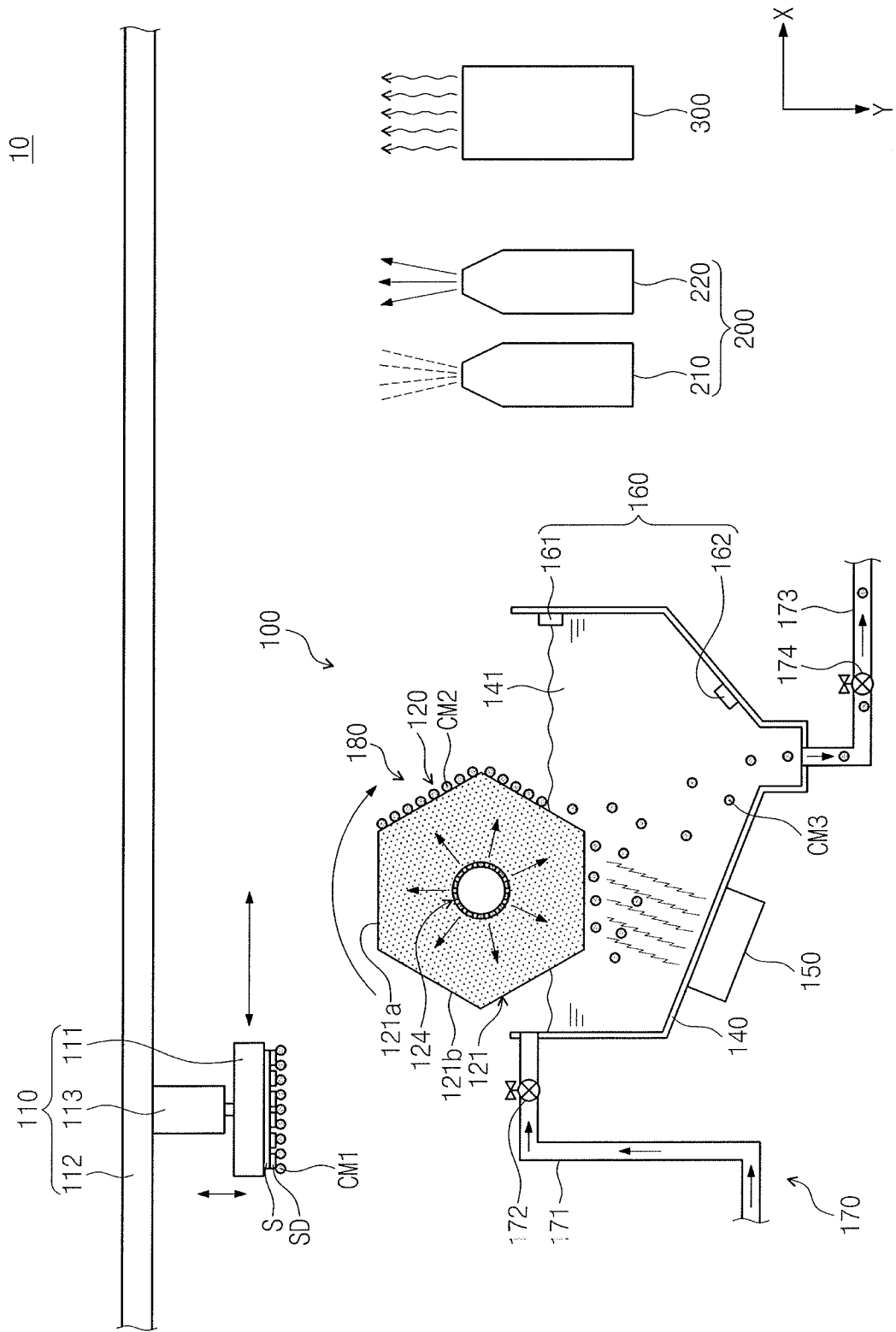
FIG. 1 illustrates a schematic diagram of a substrate processing facility according to exemplary embodiments.
Figure 2:
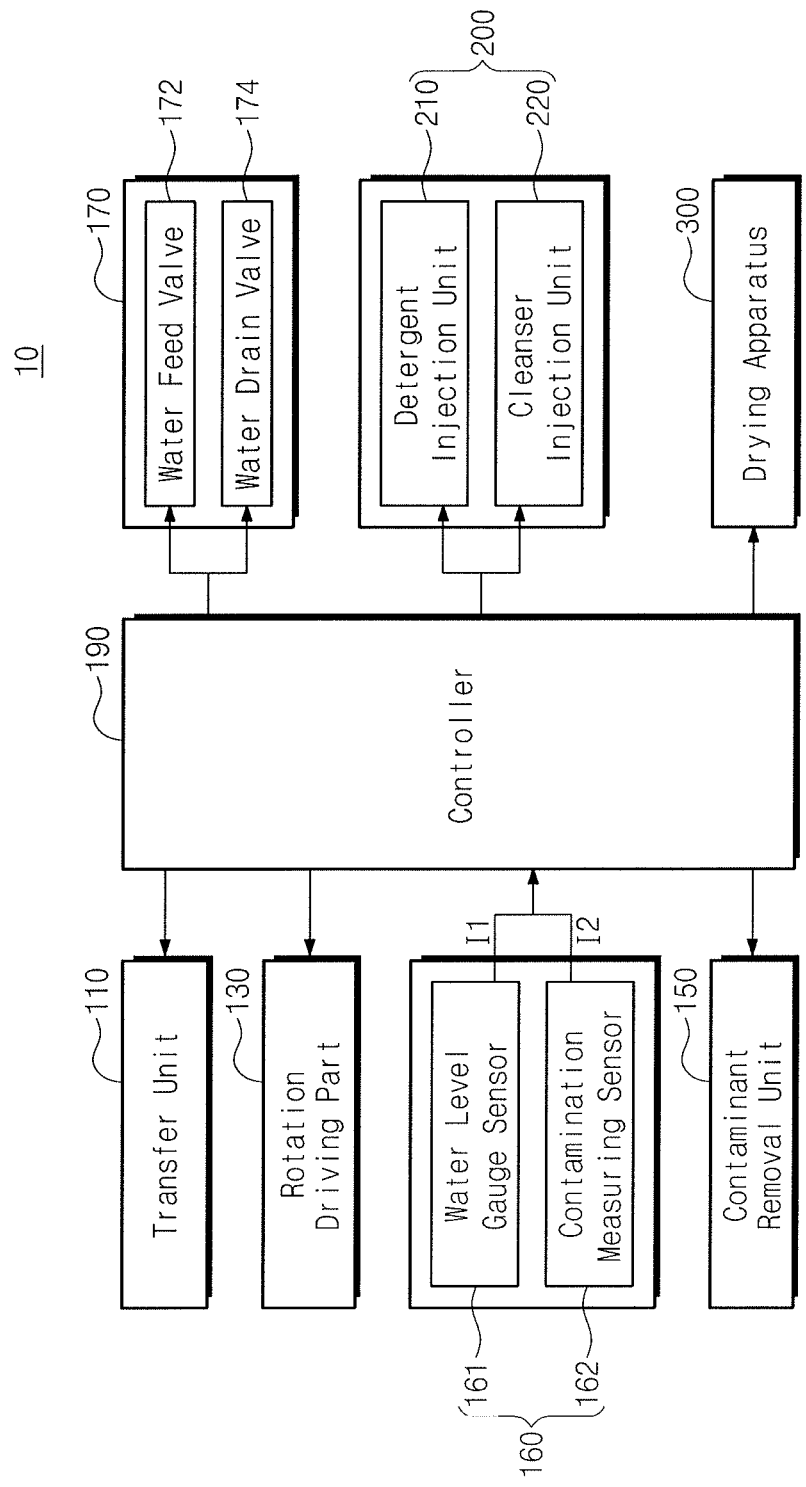
FIG. 2 illustrates a block diagram of the substrate processing facility of FIG. 1.

FIG. 1 is a schematic diagram illustrating a substrate processing facility according to exemplary embodiments. FIG. 2 is a block diagram illustrating the substrate processing facility of FIG. 1.

Referring to FIGS. 1 and 2, there may be provided a substrate processing facility 10 in which a substrate treatment process is carried out. In some embodiments, the substrate treatment process may include a cleaning process, a rinsing process, and a drying process performed on a substrate S. The substrate processing facility 10 refers to a substrate processing system.

The substrate S may include a plurality of semiconductor devices SD. The substrate S may be a semiconductor substrate or a transparent substrate. The semiconductor substrate may be, e.g., a silicon substrate, a germanium substrate, or a silicon-germanium substrate.

The semiconductor devices SD may be disposed on the substrate S. Each of the semiconductor devices SD may be fabricated by repeatedly performing a plurality of processes on the substrate S. For example, the semiconductor device SD may be fabricated by depositing layers, e.g., insulating and/or conductive layers, patterning the deposited layers to form desirable shapes, and the like. The semiconductor devices SD may include, e.g., a MOS transistor, a capacitor, etc.

The substrate processing facility 10 may include a substrate cleaning apparatus 100 and a drying apparatus 300. The substrate processing facility, i.e., system, 10 may further include a rinsing apparatus 200.

The substrate cleaning apparatus 100 may be configured to perform a cleaning process for cleaning the semiconductor devices SD and/or the substrate S. The substrate cleaning apparatus 100 may include a transfer unit 110, a cleaning unit 180, a water tub 140, a contaminant removal unit 150, a sensing unit 160, a plumbing unit 170, and a controller 190.

The cleaning unit 180 may be configured to remove contaminants CM1 produced from the semiconductor devices SD, e.g., produced during manufacturing of the semiconductor devices SD. For example, the cleaning unit 180 may remove the contaminants CM1 of the semiconductor devices SD while being in direct contact with the semiconductor devices SD. The cleaning unit 180 may include a porous suction part 120, a rotation driving part 130, and a water feed pipe 124. The cleaning unit 180 will be further described in detail with reference to FIGS. 3 and 4.

The transfer unit 110 may transfer the substrate S in at least one of X-axis and Y-axis directions. The transfer unit 110 may transfer the substrate S toward the porous suction part 120, e.g., the porous suction part 120 may be a porous cleaning element capable of absorbing liquids. The transfer unit 110 may also transfer the substrate S toward the rinsing apparatus 200 and the drying apparatus 300. The transfer unit 110 may include a transfer head 111, a transfer rail 112, and an elevation part 113.

For example, the transfer head 111 may pick up the substrate S from a substrate supply unit. In some embodiments, the transfer head 111 may pick up the substrate S which is flipped. Accordingly, the semiconductor devices SD may be disposed to face the substrate cleaning apparatus 100, e.g., the transfer head 111 may hold the substrate S with the semiconductor devices SD arranged on a surface of the substrate S facing the substrate cleaning apparatus 100. For example, the transfer head 111 may move in the X-axis direction along the transfer rail 112 so as to transfer the substrate S in the X-axis direction.

The elevation part 113 may move the transfer head 111 in the Y-axis direction so as to transfer the substrate S in the Y-axis direction. For example, when the transfer head 111 is positioned above the porous suction part 120 of the substrate cleaning apparatus 100, the elevation part 113 may drive the transfer head 111 to move in the Y-axis direction, i.e., toward the porous suction part 120. Therefore, the semiconductor devices SD may be in contact with one of cleaning surfaces 121 of the porous suction part 120. The transfer unit 110 will be further discussed in detail later with reference to FIGS. 7 to 12.

The water tub 140 may be placed under the porous suction part 120. The water tub 140 may have a shape to accommodate cleaning water 141 therein. The water tub 140 may be opened at its top side, and thus the porous suction part 120 may be partially positioned within an accommodating space of the water tub 140. The porous suction part 120 may therefore be partially soaked into the cleaning water 141.

The contaminant removal unit 150 may indirectly provide the porous suction part 120 with vibrations to remove contaminants CM2 from the porous suction part 120. The contaminant removal unit 150 may be connected to an under side of the water tub 140. The contaminant removal unit 150 may provide the cleaning water 141 with vibration to remove the contaminants CM2 of the porous suction part 120 which is soaked into the cleaning water 141. The contaminant removal unit 150 may include an ultrasonic vibrator configured to provide ultrasonic vibration to the cleaning water 141, but the present disclosure is not limited thereto, and variously suitable configurations may be selected to provide vibration to the cleaning water 141.

The sensing unit 160 may include a water level gauge sensor 161 and a contamination measuring sensor 162.

The water level gauge sensor 161 may be disposed in the water tub 140. The water level gauge sensor 161 may measure the water level of the cleaning water 141 contained in the water tub 140. The controller 190 may receive a water level information I1 of the cleaning water 141 measured by the water level gauge sensor 161 from the water level gauge sensor 161.

The contamination measuring sensor 162 may be disposed in the water tub 140. The contamination measuring sensor 162 may measure a contamination level of the cleaning water 141 contained in the water tub 140. For example, the contamination measuring sensor 162 may measure a concentration of contaminants CM3 included in the cleaning water 141. The controller 190 may receive a contamination information I2 measured by the contamination measuring sensor 162 from the contamination measuring sensor 162. The contamination information I2 may include the concentration of contaminants CM3 included in the cleaning water 141.

The plumbing unit 170 may include a water feed pipe 171, a water drain pipe 173, a water feed valve 172, and a water drain valve 174.

The water feed pipe 171 may be connected to the water tub 140, and provide the cleaning water 141 to the water tub 140. For example, the water feed pipe 171 may be connected to an uppermost lateral side of the water tub 140. The cleaning water 141 may be deionized water (DI water), but the present disclosure is not limited thereto. The water drain pipe 173 may be connected to the water tub 140 so that the cleaning water 141, the contaminants CM3, etc. may be drained from the water tub 140. The water drain pipe 173 may be connected to, e.g., a lowermost under side of the water tub 140.

The water feed valve 172 may be installed on the water feed pipe 171. The controller 190 may control the water feed valve 172 to open and close the water feed pipe 171. The water drain valve 174 may be installed on the water drain pipe 173. The controller 190 may control the water drain valve 174 to open and close the water drain pipe 173.

The controller 190 may control the transfer unit 110, the rotation driving part 130, the contaminant removal unit 150, the water feed valve 172, and the water drain valve 174. The controller 190 may also control the rinsing apparatus 200 and the drying apparatus 300. The controller 190 may control the rotation driving part 130 so as to rotate the porous suction part 120 at a predetermined angle every preset time, which will be discussed below with reference to FIG. 5.

The controller 190 may receive the information I1 and I2 measured by the water level gauge sensor 161 and the contamination measuring sensor 162. The controller 190 may use the water level information I1 so as to open and close the water feed valve 172 and/or the water drain valve 174. For example, the controller 190 may bring all of the water feed and drain valves 172 and 174 into their open states. When the water level information I1 is above a predetermined maximum water level, the controller 190 may bring the water feed valve 172 into its close state. It may therefore be possible to prevent the cleaning water 141 from overflowing the water tub 140. When the water level information I1 is below a predetermined minimum water level, the controller 190 may bring the water drain valve 174 into its close state. It may thus be possible to prevent the porous suction part 120 from not soaking in the cleaning solution 141.

The controller 190 may use the contamination information I2 so as to open and close the water feed valve 172 and/or the water drain valve 174. For example, the controller 190 may bring all of the water feed and drain valves 172 and 174 into their close states. When the contamination information I2 is above a predetermined contamination level, the controller 190 may bring all of the water feed and drain valves 172 and 174 into their open states.

The rinsing apparatus 200 may be disposed between the substrate cleaning apparatus 100 and the drying apparatus 300. The rinsing apparatus 200 may be positioned on a transfer passage of the substrate S which is transferred by the transfer unit 110. The rinsing apparatus 200 may remove contaminants CM1' of FIG. 10 remaining on the semiconductor devices SD and/or the substrate S. The rinsing apparatus 200 may include a detergent injection unit 210 and a wash injection unit 220.

The detergent injection unit 210 may be placed between the substrate cleaning apparatus 100 and the wash injection unit 220. The detergent injection unit 210 may inject a detergent solution toward the substrate S that has passed through the substrate cleaning apparatus 100. The detergent solution may include a surfactant, but the present disclosure is not limited thereto. The detergent solution may remove the contaminants CM1' on the semiconductor devices SD and/or the substrate S.

The wash injection unit 220 may be placed between the detergent injection unit 210 and the drying apparatus 300. The wash injection unit 220 may inject a washing solution toward the substrate S that has passed through the detergent injection unit 210. Accordingly, the washing solution may remove the detergent solution remaining on the semiconductor devices SD and/or the substrate S. The washing solution may be deionized water, but the present disclosure is not limited thereto.

The drying apparatus 300 may dry the substrate S that has passed through the rinsing apparatus 200. The drying apparatus 300 may be positioned on the transfer passage of the substrate S which is transferred by the transfer unit 110. The drying apparatus 300 may inject high temperature dry air to the substrate S. The dry air may evaporate the washing solution remaining on the substrate S and/or the semiconductor devices SD. In other word, the washing solution may be removed. Therefore, the drying apparatus 300 may prevent the semiconductor devices SD from stains caused by the washing solution.

Alternatively, the substrate processing facility 10 may have no rinsing apparatus 200. In this case, the drying apparatus 300 may inject high temperature dry air toward the substrate S that has passed through the substrate cleaning apparatus 100. Thus, the drying apparatus 300 may prevent the semiconductor devices SD from stains caused by the cleaning water 141.

Figure 3:
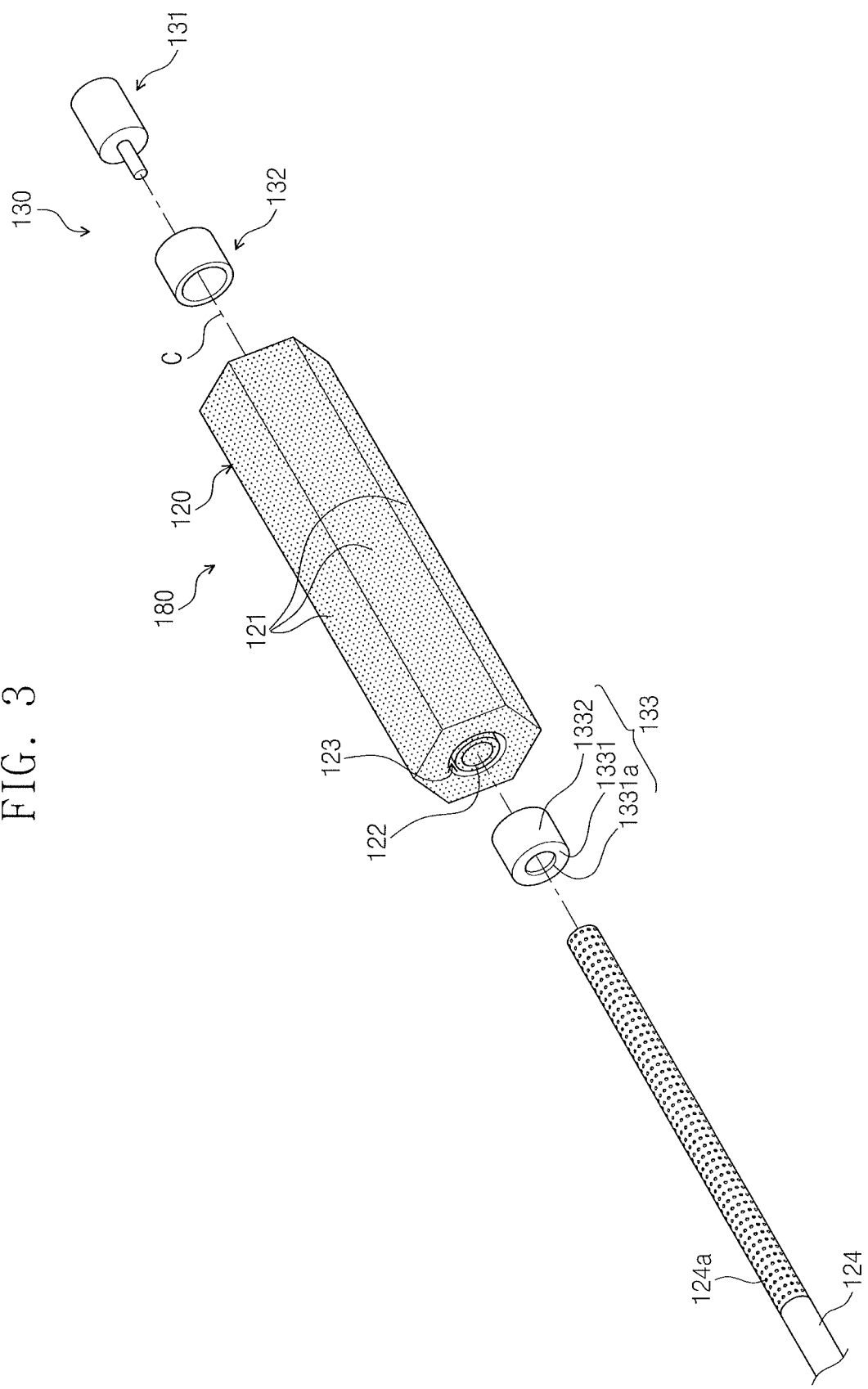
FIG. 3 illustrates an exploded perspective view of a portion of the cleaning unit of FIG. 1.
Figure 4:
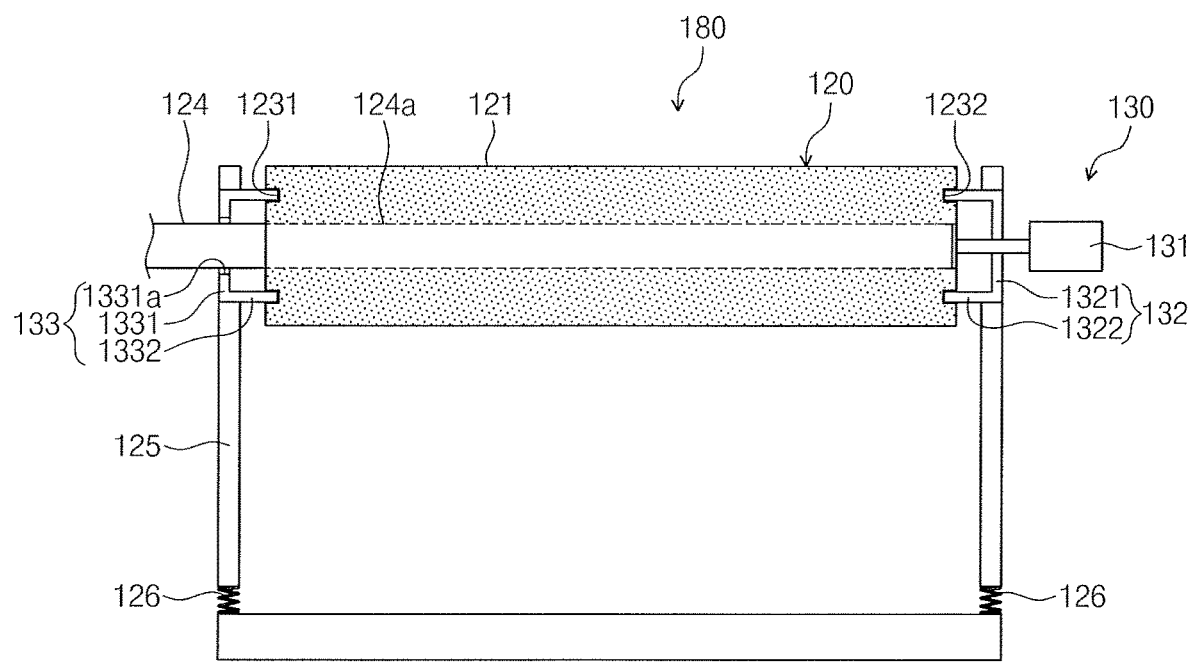
FIG. 4 illustrates a schematic cross-sectional view of the cleaning unit of FIG. 3.

FIG. 3 is an exploded perspective view illustrating a portion of the cleaning unit 180. FIG. 4 is a cross-sectional view schematically illustrating the cleaning unit 180.

Referring to FIGS. 1 to 4, the cleaning unit 180 may include the porous suction part 120, the rotation driving part 130, and the water feed pipe 124 as formerly discussed with reference to FIGS. 1 and 2. The cleaning unit 180 may further include a supporting part 125 and a shock absorbing part 126, as illustrated in FIG. 4.

The porous suction part 120 may be a porous cleaning element that absorbs liquids. The porous suction part 120 may be shaped like a polygonal pillar having the plurality of cleaning surfaces 121. For example, the porous suction part 120 may have opposing ends having a shape of a regular polygon, e.g., the cross section of the porous suction part 120 may be a hexagon (FIG. 1). The cleaning surfaces 121 may connect the opposing ends of the porous suction part 120 to each other. In other words, the cleaning surfaces 121 may constitute outer circumferential surfaces of the porous suction part 120. In some embodiments, the porous suction part 120 may be shaped like a hexagonal pillar having six cleaning surfaces 121. In other embodiments, the porous suction part 120 may be shaped like, e.g., a triangular pillar, a square pillar, a pentagonal pillar, an octagonal pillar, etc. The cleaning surfaces 121 may be formed flat. The contaminants CM2 may stick to each of the cleaning surfaces 121 during removal of the contaminants CM1 from the semiconductor devices SD.

The porous suction part 120 may be formed of a polyvinyl alcohol (PVA) sponge having superior characteristics, e.g., hygroscopicity, durability, moisture retention, fire resistance, etc., but the present disclosure is not limited thereto. The substrate S may be in contact with one of the cleaning surfaces 121 of the porous suction part 120, and thus, the contaminants CM1 may be removed from the semiconductor devices SD, which will be discussed below with reference to FIGS. 7 to 12.

The porous suction part 120 may include the water feed pipe 124 disposed therein. For example, the porous suction part 120 may include an insert groove 122, into which the water feed pipe 124 is inserted. In some embodiments, the insert groove 122 may extend along a longitudinal direction of the porous suction part 120 from one end of the porous suction part 120. In other words, the insert groove 122 may extend from one end of the porous suction part 120 toward the opposite end of the porous suction part 120. The insert groove 122 may be positioned on an imaginary rotation axis C of the porous suction part 120. In other embodiments, the porous suction part 120 may include an insert hole inside thereof so that the water feed pipe 124 may penetrate through the insert hole.

The rotation driving part 130 may rotate the porous suction part 120 at a predetermined angle. In some embodiments, the rotation driving part 130 may rotate the hexagonal-shaped porous suction part 120 at about 60° every preset time (e.g., two months). The rotation driving part 130 may include a motor 131 and connection members 132 and 133.

The connection members 132 and 133 may couple the porous suction part 120 to the motor 131. The connection members 132 and 133 may also couple the porous suction part 120 to the supporting part 125. In some embodiments, the connection members 132 and 133 may include a first connector 133, which is connected to a first end of the porous suction part 120, and a second connector 132 which is connected to a second end, i.e., opposite, the first end of the porous suction part 120.

The first connector 133 may include a first base portion 1331 and a first side portion 1332. The first connector 133 may have a cylindrical shape. The first base portion 1331 may be shaped like a disk plate, but the present disclosure is not limited thereto. The first base portion 1331 may have a penetration hole 1331a through which the water feed pipe 124 penetrates. The penetration hole 1331a may be positioned at a center of the first base portion 1331. The first side portion 1332 may extend toward the one end of the porous suction part 120 from an edge of the first base portion 1331. The first side portion 1332 may be inserted into a first connecting slot 1231 at the first end of the porous suction part 120. Accordingly, the first connector 133 may be engaged with the first end of the porous suction part 120.

The second connector 132 may include a second base portion 1321 and a second side portion 1322. The second connector 132 may have a cylindrical shape. The second base portion 1321 may be shaped like a disk plate, but the present disclosure is not limited thereto. The second side portion 1322 may extend toward the opposite end of the porous suction part 120 from an edge of the second base portion 1321. The second side portion 1322 may be inserted into a second connecting slot 1232 at the second end of the porous suction part 120. Accordingly, the second connector 132 may be engaged with the second end of the porous suction part 120.

The motor 131 may be coupled to the second connector 132. In some embodiments, the motor 131 may be coupled to a center of the second base portion 1321, and thus, the second connector 132 may receive a rotational force from the motor 131. Accordingly, the porous suction part 120 may rotate in response to the rotational movement of the second connector 132. The motor 131 may be driven by the controller 190. The controller 190 may control the motor 131 to adjust a rotational angle of the porous suction part 120.

The water feed pipe 124 may be disposed inside the porous suction part 120. In some embodiments, the water feed pipe 124 may be inserted into the insert groove 122 of the porous suction part 120. The water feed pipe 124 may be a circular duct, the present disclosure is not limited thereto. The water feed pipe 124 may penetrate the penetration hole 1331a of the first connector 133 so as to enter into the insert groove 122 of the porous suction part 120. One or more ball bearings may be disposed between the water feed pipe 124 and the penetration hole 1331a. The ball bearing may prevent the water feed pipe 124 from rotating when the porous suction part 120 is rotated.

The water feed pipe 124 may allow the cleaning water 141 to flow through the inside thereof. The water feed pipe 124 may include a plurality of discharge holes 124a. The cleaning water 141 is discharged out of the water feed pipe 124 through the plurality of discharge holes 124a. The plurality of discharge holes 124a may be disposed on an outer circumferential surface of the water feed pipe 124. For example, the plurality of discharge holes 124a may be disposed at an equal interval in a circumferential direction along the outer circumferential surface of the water feed pipe 124 in such as way that the cleaning water 141 may be discharged in all directions around the water feed pipe 124. For example, the cleaning water 141 may be, e.g., continuously, discharged out of the water feed pipe 124 through the discharge holes 124a in a radial direction (along arrows in FIG. 1) into the porous suction part 120 during the cleaning process. Accordingly, the porous suction part 120 may evenly absorb the cleaning water 141 discharged from the water feed pipe 124.

As the porous suction part 120 sucks, e.g., absorbs, the cleaning water 141 provided from the water feed pipe 124, the cleaning surfaces 121 may be cleaned, e.g., the cleaning surfaces 121 may include the cleaning water 141 therein to facilitate rubbing of the semiconductor devices SD and removal of the contaminants CM1 therefrom as will be described in more detail below with reference to FIGS. 5A-6C. Therefore, the porous suction part 120 absorbing the cleaning water 141 may remove the contaminants CM1 more effectively than a porous suction part without water therein.

The supporting part 125 may support the porous suction part 120. In some embodiments, the supporting part 125 may hold lower portions of the first and second connectors 132 and 133 to support the porous suction part 120.

The shock absorbing part 126 may be connected to a lower portion of the supporting part 125. An external force provided to the porous suction part 120 may be transmitted to the shock absorbing part 126 through the supporting part 125. The shock absorbing part 126 may be deformed when being provided with the external force. The shock absorbing part 126 may be a resilient member, e.g., a spring, but the present disclosure is not limited thereto.

It will be described as an example that the shock absorbing part 126 absorbs the external force exerted on the porous suction part 120.

In detail, when the elevation part 113 transfer, e.g., lowers, the substrate S in the Y-axis direction toward the porous suction part 120, the semiconductor devices SD contact one of the cleaning surfaces 121 of the porous suction part 120. In this description, the cleaning surface 121 in contact with the semiconductor devices SD may be referred to hereinafter as a first contact cleaning surface 121a. That is, when the semiconductor devices SD contact the first contact cleaning surface 121a (as a result of the vertical movement of the elevation part 113), the porous suction part 120 may be applied with an external force from the semiconductor devices SD (resulting from the contact). The semiconductor devices SD may also be provided with an equal and opposite external force from the porous suction part 120. The elevation part 113 may further move the substrate S in the Y-axis direction while the semiconductor devices SD are in contact with the first contact cleaning surface 121a.

At this step, an increased external force may be exerted on the porous suction part 120 and the semiconductor devices SD. Therefore, if the semiconductor devices SD were to be provided with an external force of more than a predetermined value (e.g., about 20N) without the shock absorbing part 126, the semiconductor devices SD could break. However, as the shock absorbing part 126 may be compressively deformed by partially absorbing the external force exerted on the porous suction part 120, the porous suction part 120 may infinitesimally move in the Y-axis direction and the external force exerted on the semiconductor devices SD may be reduced. Accordingly, the shock absorbing part 126 may prevent damage of the semiconductor devices SD.

Figure 5A:
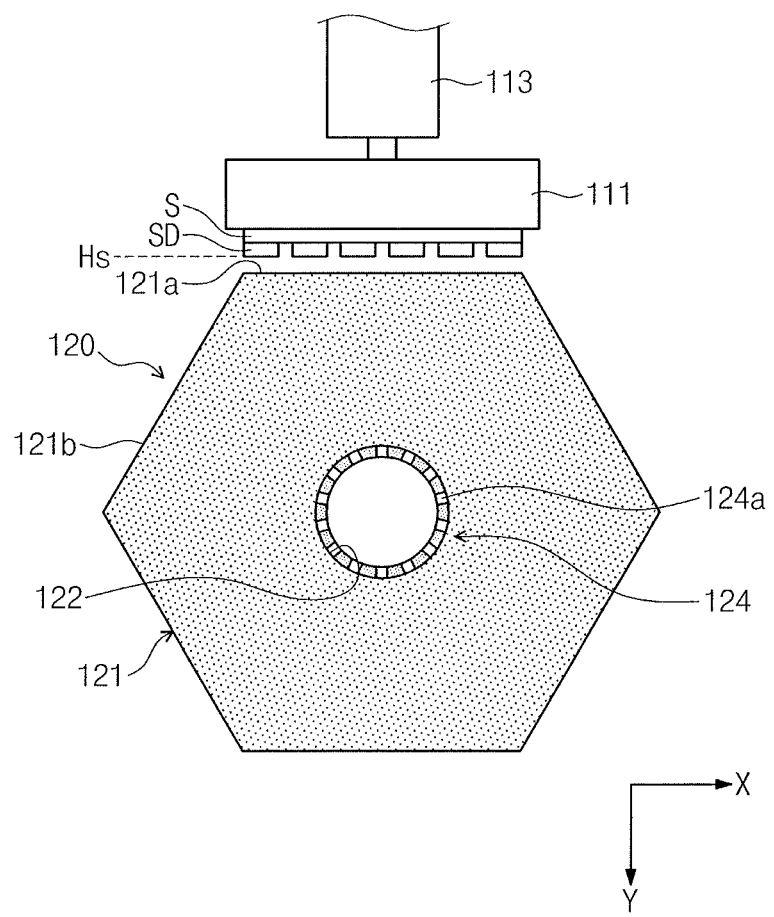
FIGS. 5A and 5B illustrate schematic diagrams of rotational movement of the porous suction part of FIG. 1.
Figure 5B:
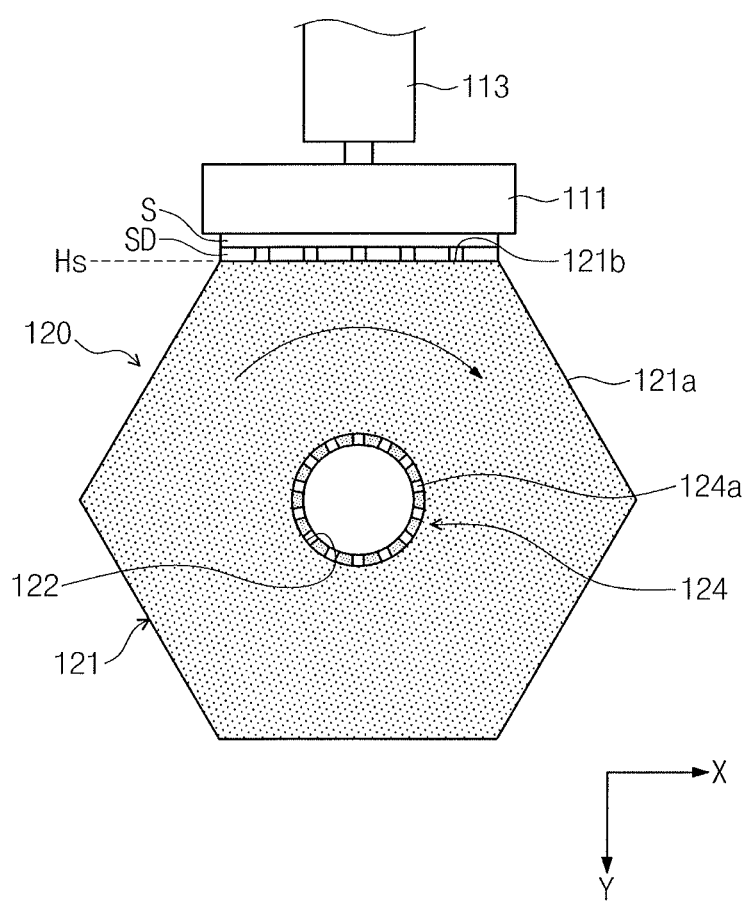

FIGS. 5A and 5B are schematic diagrams illustrating rotational movement of the porous suction part 120.

Referring to FIGS. 1 and 5A, the elevation part 113 of the transfer unit 110 may move the transfer head 111 in the Y-axis direction so as to put the semiconductor devices SD into place at a predetermined reference height Hs. When the semiconductor devices SD are positioned at the reference height Hs, the first contact cleaning surface 121a may be in contact with the semiconductor devices SD. The first contact cleaning surface 121a may be placed adjacent to the substrate S and other cleaning surfaces 121 may be placed away from the substrate S.

The first contact cleaning surface 121a may be disposed to correspond to the reference height Hs. In this description, the phrase of being "disposed to correspond to the reference height Hs" means being disposed at a height equivalent to or above the reference height Hs.

When the semiconductor devices SD and the first contact cleaning surface 121a are in contact with each other, the first contact cleaning surface 121a may be provided with an external force (e.g., less than about 20N) from the semiconductor devices SD, e.g., due to the downward motion of the elevation part 113 discussed previously. When the external force is provided from the semiconductor devices SD, the first contact cleaning surface 121a may be positioned, e.g., pushed, under the reference height Hs. When no external force is provided from the semiconductor devices SD, e.g., when application of the external force stops, the first contact cleaning surface 121a may be disposed to correspond to the reference height Hs due to the restoring force of the porous suction part 120. When the external force is repeatedly provided to the first contact cleaning surface 121a, even the restoring force of the porous suction part 120 may fail to put, e.g., restore, the first contact cleaning surface 121a into the position that corresponds to the reference height Hs. In this case, the semiconductor devices SD may not be in contact with the first contact cleaning surface 121a. Therefore, the first contact cleaning surface 121a may hardly remove the contaminants CM1 from the semiconductor devices SD. For example, if the first contact cleaning surface 121a were to be maintained permanently at a position facing the semiconductor devices SD, the repeated downward motion of the elevation part 113 over time could have caused the first contact cleaning surface 121a to be spaced apart from the semiconductor devices SD, thereby minimizing removal of the contaminants CM1 from the semiconductor devices SD.

In contrast, referring to FIGS. 1 and 5B, the porous suction part 120 according to embodiments rotates while contacting the semiconductor devices SD. That is, the rotation driving part 130 of FIG. 2 may rotate the porous suction part 120 at a predetermined angle every preset time. Thus, a different cleaning surface 121b (referred to hereinafter as a second contact cleaning surface) may be placed adjacent to the substrate S, while other cleaning surfaces 121, including the first contact cleaning surface 121a, may be placed away from the substrate S. As the second contact cleaning surface 121b is not provided with the external force from the semiconductor devices SD for longer than a predetermined period, the second contact cleaning surface 121b may be disposed to correspond to the reference height Hs. The second contact cleaning surface 121b may then be in contact with the semiconductor devices SD, and then the contaminants CM1 may be removed from the semiconductor devices SD.

As the porous suction part 120 rotates at a predetermined angle, the first contact cleaning surface 121a may not be provided, e.g., constantly, with the external force from the semiconductor devices SD. Therefore, the first contact cleaning surface 121a may return to its initial position due to the restoring force of the porous suction part 120. As the porous suction part 120 rotates at a preset time, a different cleaning surfaces 121 contacts the semiconductor devices SD at the preset time, thereby minimizing application of the external force to a same contact cleaning surface 121 for longer than the preset time, i.e., the predetermined period. Further, rotation of the porous suction part 120 and contact of the semiconductor devices SD with the different cleaning surfaces 121 allows for longer cleaning time, which in turn, facilitates removal of the contaminants CM1 from the semiconductor devices SD. Once the removed contaminants CM1 attach to the porous suction part 120, i.e., become contaminants CM2, the contaminant removal unit 150 removes the contaminants CM2 from the porous suction part 120, and the first contact cleaning surface 121a may come back in contact with the semiconductor devices SD. In other words, the porous suction part 120 may be semi-permanently used, e.g., the porous suction part 120 may be rotatable at constant intervals to be periodically rotatable.

Figure 6C:
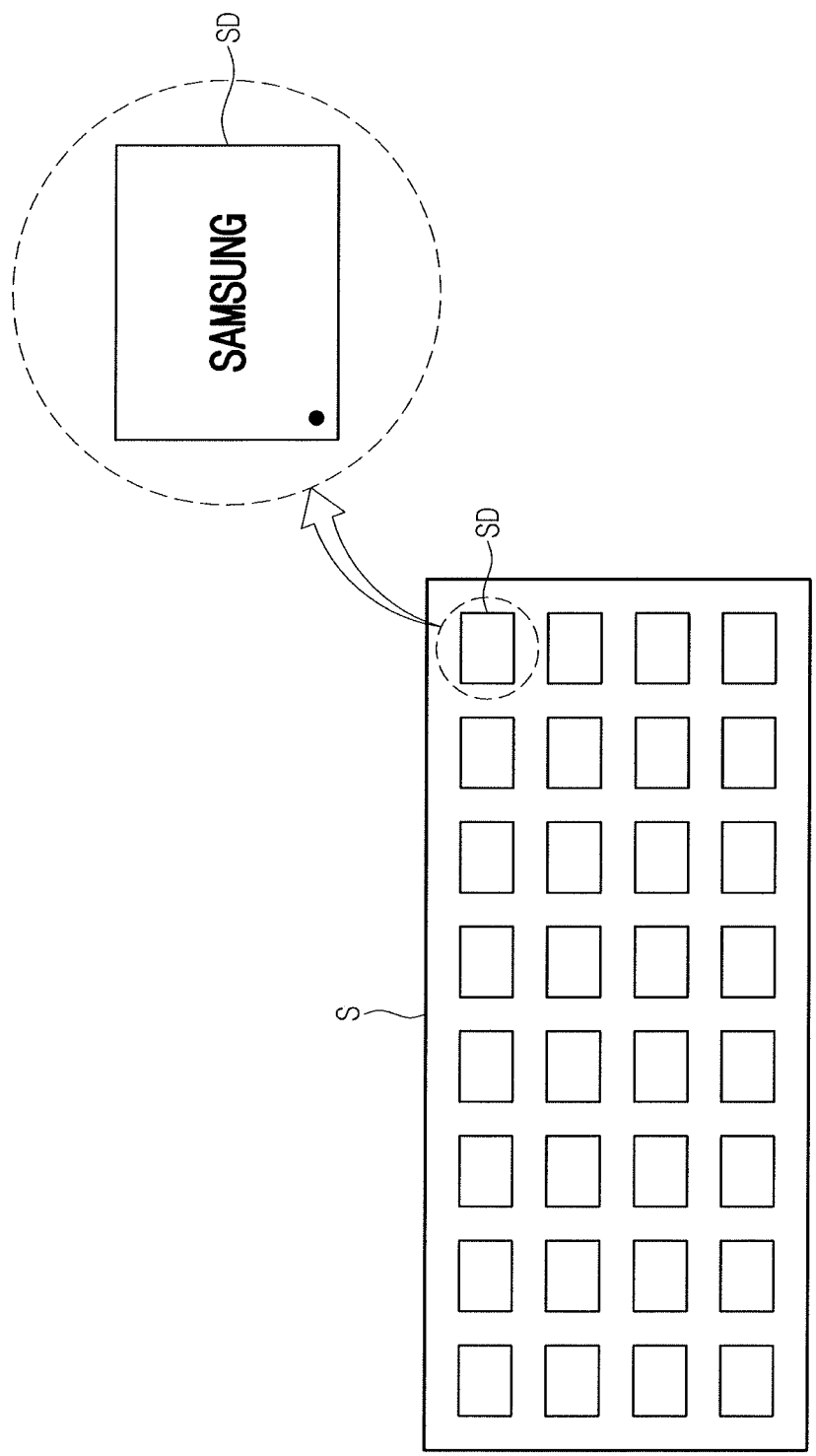

FIGS. 6A to 6C are plan views illustrating changing shape of a substrate processed by the substrate processing facility of FIG. 1. FIG. 6A shows a substrate before passing through the substrate cleaning apparatus. FIG. 6B shows a substrate after passing through the substrate cleaning apparatus. FIG. 6C shows a substrate passing through the substrate cleaning apparatus and other apparatus.

Referring back to FIG. 1, the semiconductor devices SD may be disposed on the substrate S. Thereafter, a molding processing may be performed on the semiconductor devices SD. For example, a saw sorter may be employed to perform a sawing process on the molded semiconductor devices SD. The contaminants CM1 may be adhered to the semiconductor devices SD during the sawing process and/or other process. Marks may be inscribed on the semiconductor devices SD. At this step, the semiconductor devices SD may be contaminated by the contaminants CM1, e.g., soot.

For example, referring to FIG. 6A, the contaminants CM1 may be positioned along edges of the semiconductor devices SD. The contaminants CM1 may reduce appearance quality and induce defect of the semiconductor devices SD.

During the cleaning process described previously with reference to FIGS. 5A-5B, the semiconductor devices SD may be contacted with one of the cleaning surfaces 121 of the porous suction part 120, and then the contaminants CM1 may be mostly removed from the semiconductor devices SD, as illustrated in FIG. 6B. For example, the substrate cleaning apparatus 100 of FIG. 1 may remove about 90 percent of the contaminants CM1. However, about 10 percent of the contaminants CM1' may remain on the semiconductor devices SD.

Referring to FIG. 6C, the detergent injection unit 210 of FIG. 1 may inject the detergent solution toward the substrate S so that the remaining contaminants CM1' may be mostly removed from the semiconductor devices SD. The semiconductor devices SD may then have an enhanced appearance quality. The semiconductor devices SD may also have a reduced defect rate.

Hereinafter, a method for processing a substrate using the substrate processing facility 10 will be described with reference to FIGS. 7-11. FIGS. 7 to 11 are schematic diagrams illustrating cleaning, rinsing, and drying processes performed by the substrate processing facility 10.

Figure 7:
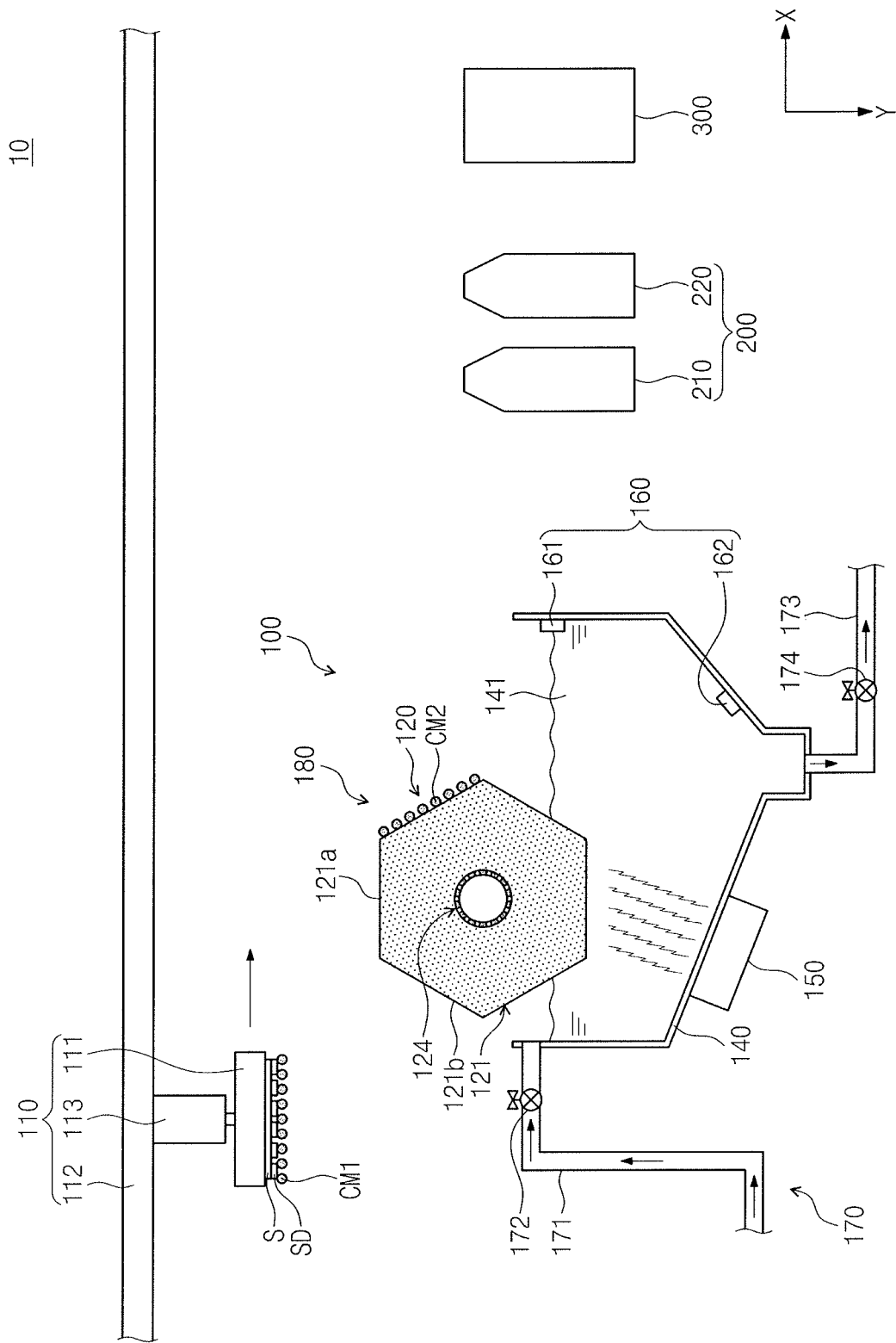
FIGS. 7 to 11 illustrate schematic diagrams of cleaning, rinsing and drying processes performed by the substrate processing facility of FIG. 1.
Figure 8:
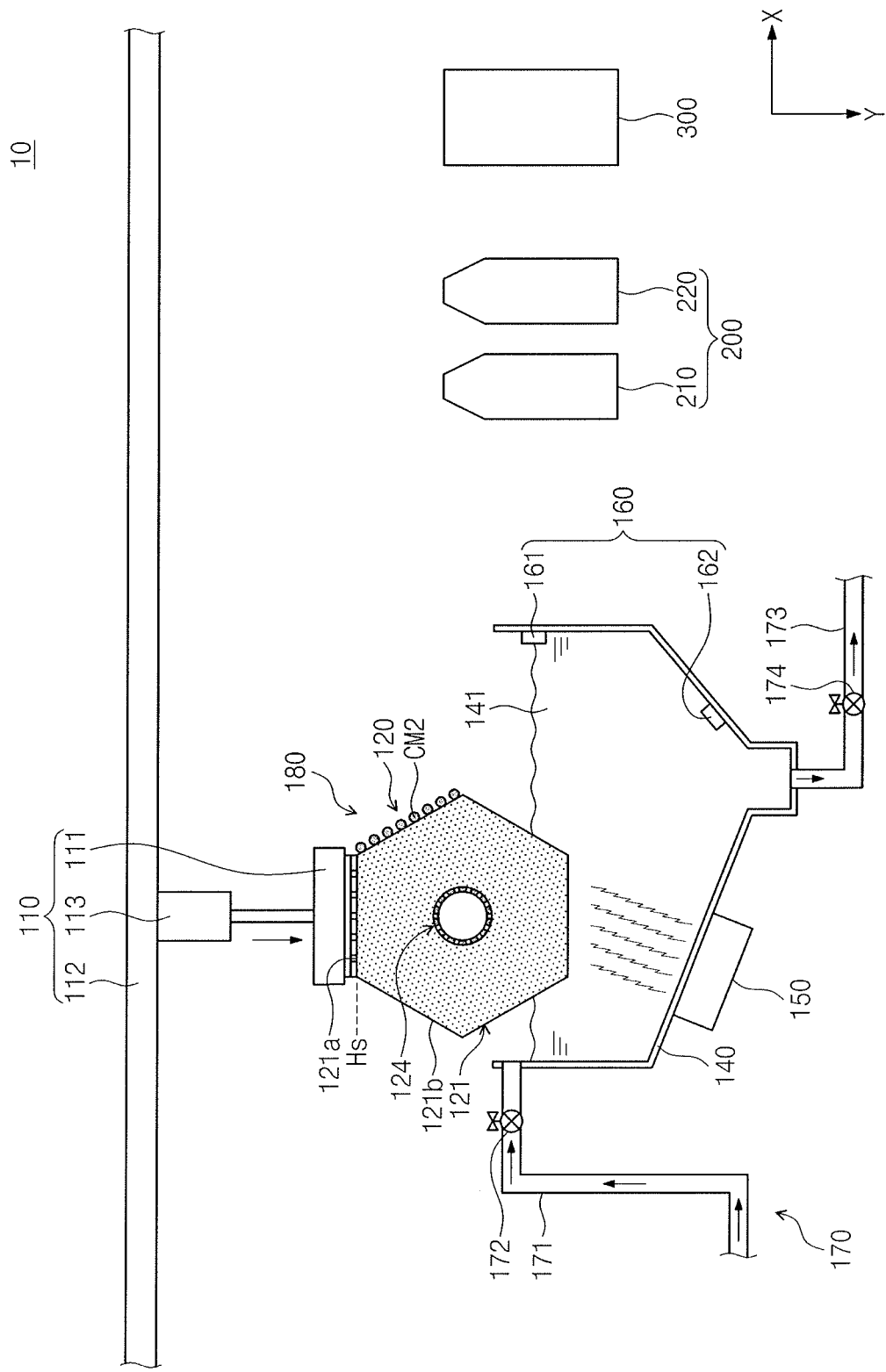

Referring to FIGS. 7 and 8, the transfer unit 110 may pick up the substrate S including the semiconductor devices SD from a substrate supply unit. After picking up the substrate 5, the transfer unit 110 may transfer the substrate S toward the porous suction part 120, as illustrated in FIG. 7. For example, the transfer unit 110 may lower the semiconductor devices SD toward the porous suction part 120 to contact one of the cleaning surfaces 121 of the porous suction part 120, as illustrated in FIG. 8.

Figure 9:
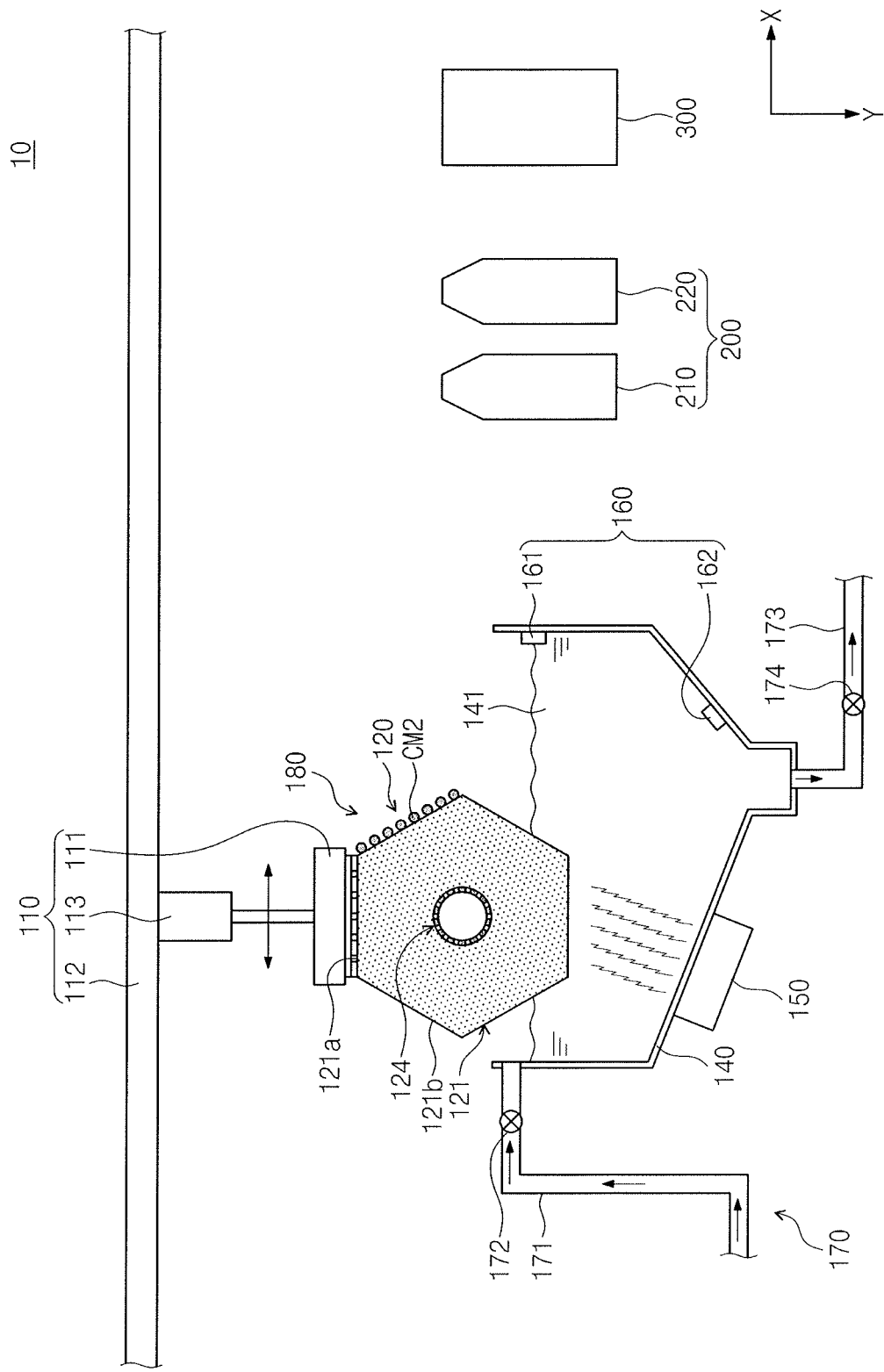

Referring to FIG. 9, the transfer unit 110 may reciprocally move the substrate S in a linear direction parallel to the first contact cleaning surface 121a, e.g., along the X-axis, while the semiconductor devices SD are in contact with the first contact cleaning surface 121a. In other words, the transfer unit 110 may rub the semiconductor devices SD against the first contact cleaning surface 121a. The contaminants CM1 may then be firstly removed from the semiconductor devices SD. At this step, the contaminants CM1 may be adhered to the first contact cleaning surface 121a.

Figure 10:
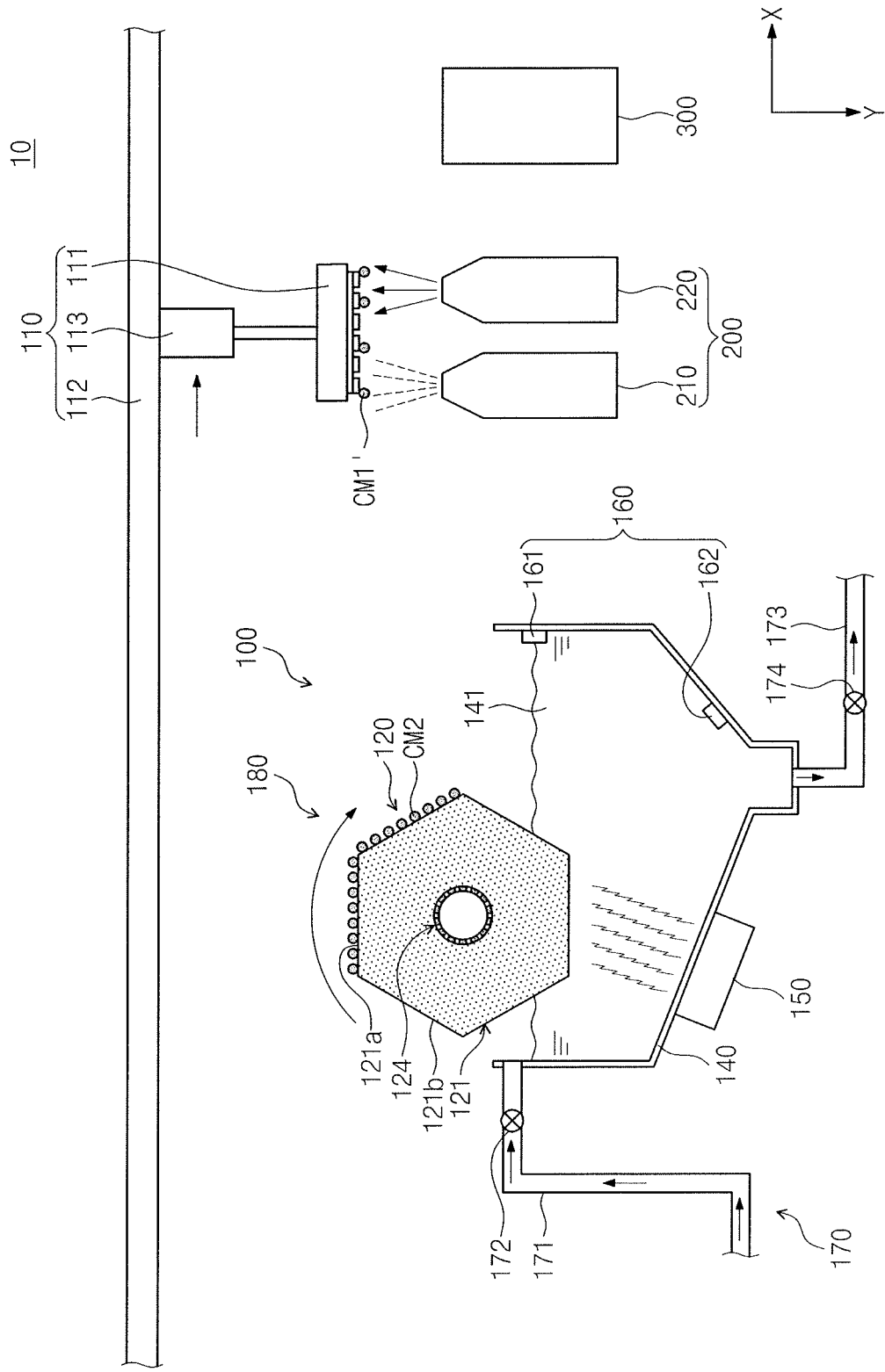

Referring to FIG. 10, after the substrate S passes through the substrate cleaning apparatus 100, the transfer unit 110 may transfer the substrate S toward the detergent injection unit 210. The detergent injection unit 210 may inject the detergent solution toward the substrate S. The remaining contaminants CM1' may then be secondly removed from the semiconductor devices SD.

After the substrate S passes through the detergent injection unit 210, the transfer unit 110 may transfer the substrate S toward the wash injection unit 220. The wash injection unit 220 may inject the washing solution toward the substrate S. The washing solution may then remove the detergent solution remaining on the semiconductor devices SD and/or the substrate S.

Figure 11:
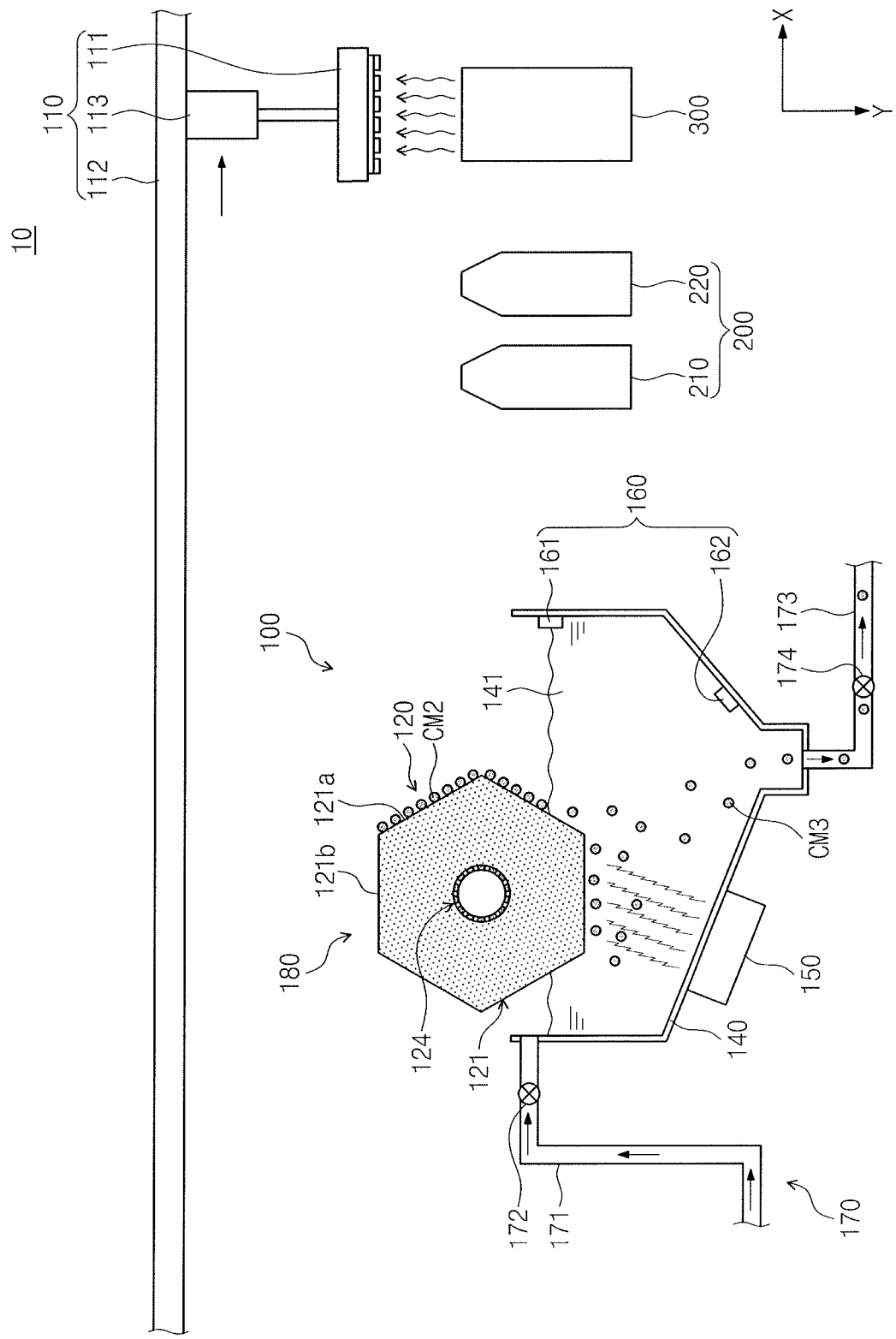

Referring to FIG. 11, after the substrate S passes through the wash injection unit 220, the transfer unit 110 may transfer the substrate S toward the drying apparatus 300. The drying apparatus 300 may inject dry air to the substrate S. The washing solution may then be removed from the semiconductor devices SD and/or the substrate S.

Referring to FIGS. 10-11, the rotation driving part 130 may rotate the porous suction part 120 to put the first contact cleaning surface 121 a into position within the water tub 140. As such, the first contact cleaning surface 121a may be soaked into the cleaning water 141. The first contact cleaning surface 121a may be provided with vibration via the cleaning water 141. The contaminants CM2 may then be removed from the first contact cleaning surface 121a, i.e., contaminants CM2 removed from the porous suction part 120 into the cleaning water 141 become the contaminants CM3. The contaminants CM3 removed from the first contact cleaning surface 121a may be drained out of the water tub 140 through the water drain pipe 173.

Figure 12:
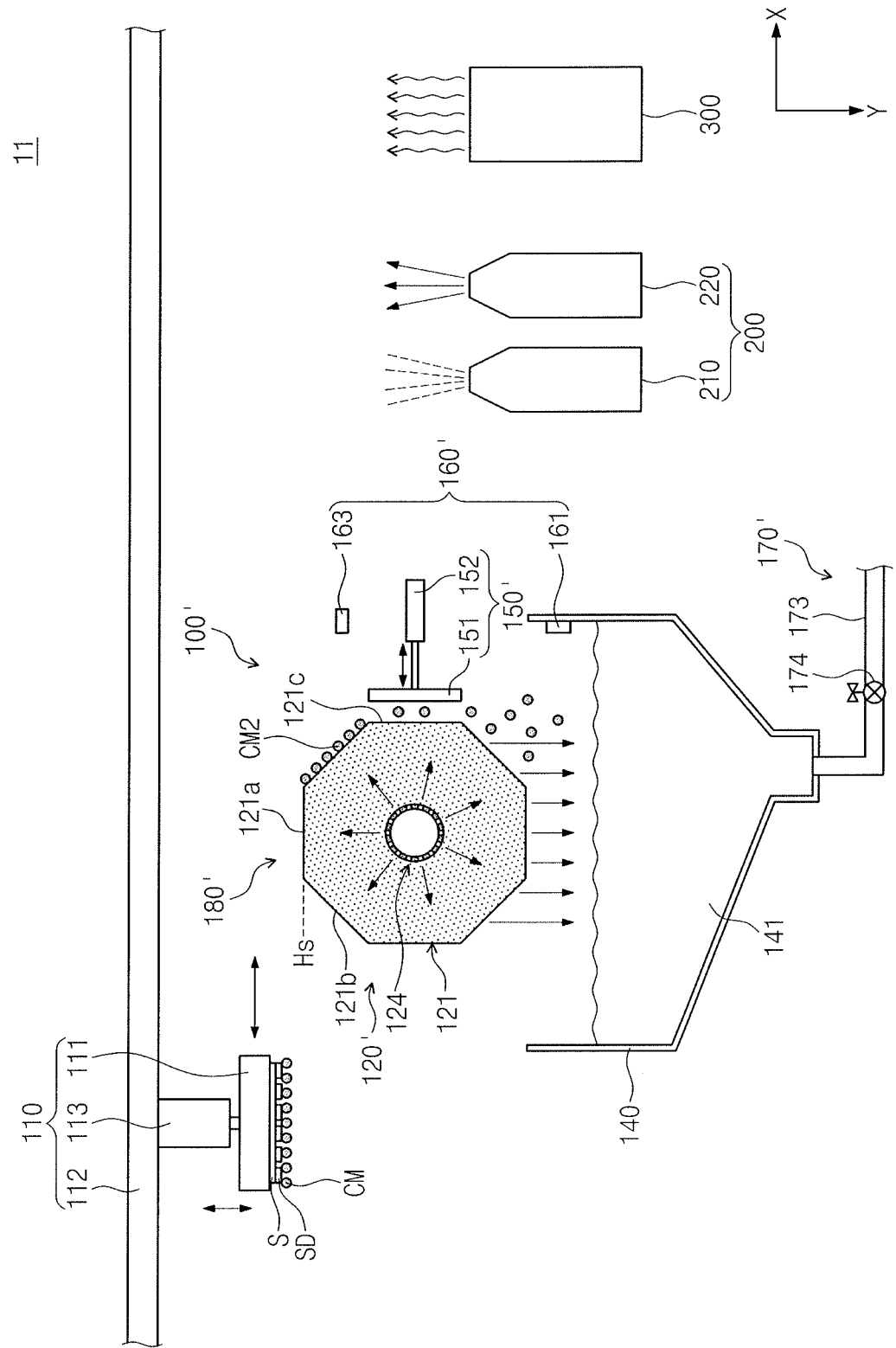
FIG. 12 illustrates a schematic diagram of a substrate processing facility according to exemplary embodiments.
Figure 13:
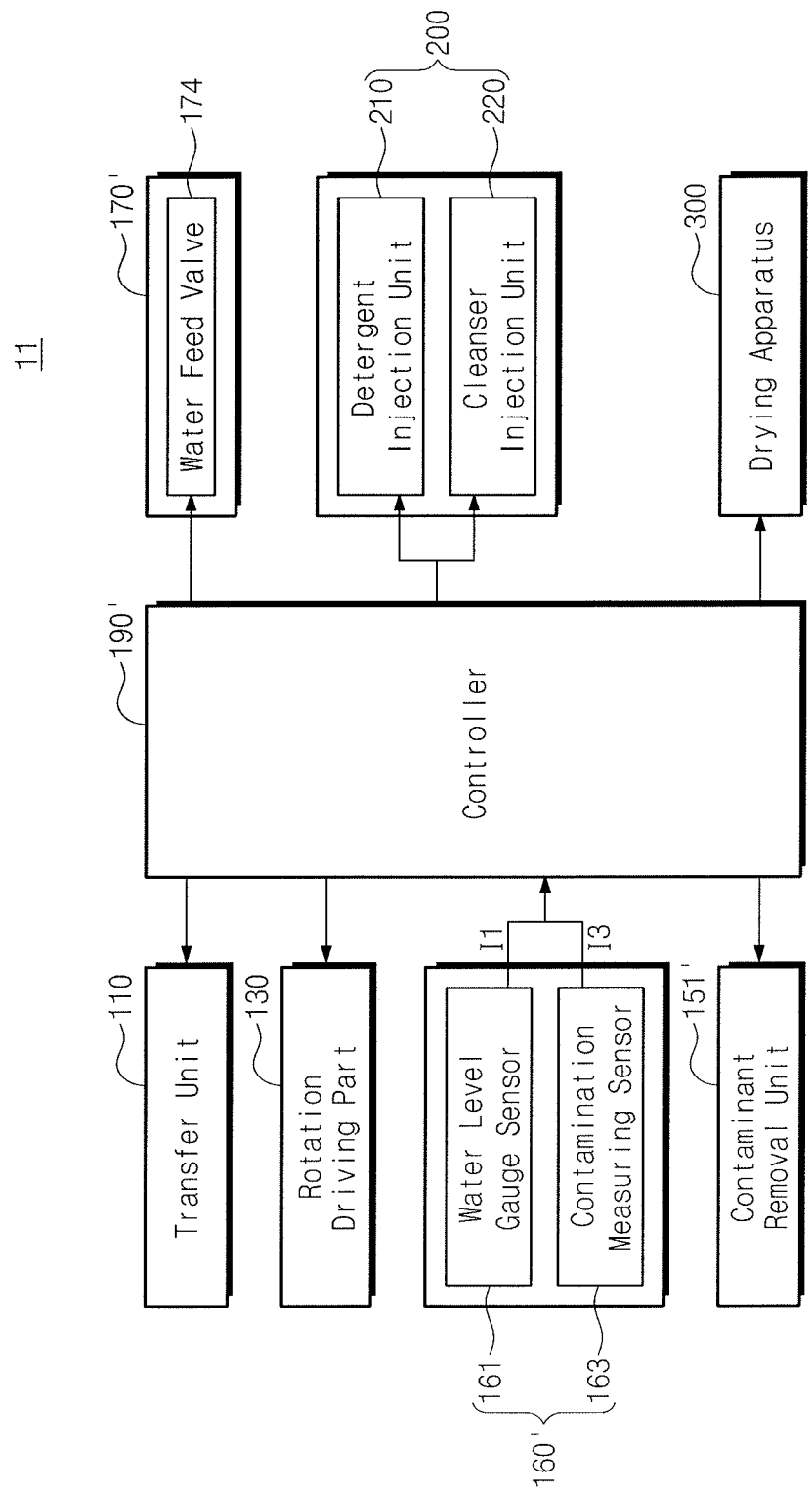
FIG. 13 illustrates a block diagram of the substrate processing facility of FIG. 12.

FIG. 12 is a schematic diagram illustrating a substrate processing facility according to exemplary embodiments. FIG. 13 is a block diagram illustrating the substrate processing facility of FIG. 12. In the embodiment that follows, a discussion of features substantially identical to those explained with reference to FIGS. 1 to 4 will be omitted in the interest of brevity.

Referring to FIGS. 12 and 13, a substrate processing facility 11 may include a substrate cleaning apparatus 100', the rinsing apparatus 200, and the drying apparatus 300. The substrate cleaning apparatus 100' may include the transfer unit 110, a cleaning unit 180', the water tub 140, a contaminant removal unit 150', a sensing unit 160', a plumbing unit 170', and a controller 190'.

The cleaning unit 180' may include a porous suction part 120', the water feed pipe 124, and the rotation driving part 130. The porous suction part 120' may be shaped like an octagonal pillar having eight cleaning surfaces 121. The porous suction part 120' may be provided with the cleaning water 141 through the water feed pipe 124 disposed inside the porous suction part 120'. The porous suction part 120' may be positioned on a transfer passage of a substrate S. One of the cleaning surfaces 121 may be in contact with the substrate S being transferred, and thus contaminants CM1 may be removed from semiconductor devices SD on the substrate S.

The contaminant removal unit 150' may directly provide vibration to one of the cleaning surfaces 121 which is not in contact with the semiconductor devices SD. In some embodiments, the contaminant removal unit 150' may include a contact plate 151 and a driving part 152 that reciprocally moves the contact plate 151. The contact plate 151 may be disposed in parallel to one 121c (referred hereinafter to as a pressing cleaning surface) of the cleaning surfaces 121 which is not in contact with the semiconductor devices SD. the pressing cleaning surface 121c may be a closest to the contaminant removal unit 150' from the cleaning surfaces 121. The driving part 152 may be a hydraulic cylinder, but the present disclosure is not limited thereto. The driving part 152 may reciprocally move the contact plate 151 in a direction vertical to the pressing cleaning surface 121c, which may provide vibration to the pressing cleaning surface 121c. Contaminants CM2 may then be removed from the cleaning surfaces 121. Also, the porous suction part 120' may release the cleaning water 141 sucked thereinto.

The water tub 140 may be placed under the porous suction part 120'. The water tub 140 may accommodate the contaminants CM2 which are detached from the cleaning surfaces 121 by the contaminant removal unit 150' and/or gravity. The water tub 140 may also accommodate the cleaning water 141 which is discharged from the porous suction part 120' by the contaminant removal unit 150' and/or gravity.

The plumbing unit 170' may include the water drain pipe 173 which is connected to an under side of the water tub 140 and the water drain valve 174 which is operated to open and close the water drain pipe 173.

The sensing unit 160' may include the water level gauge sensor 161 configured to measure a water level of the cleaning water 141 contained in the water tub 140 the height measuring sensor 163 configured to measure a height of a first contact cleaning surface 121a which is in contact with the semiconductor devices SD. A measured height information 13 of the first contact cleaning surface 121a may be transmitted to the controller 190' from the height measuring sensor 163. The height measuring sensor 163 may be a laser sensor, but the present disclosure is not limited thereto.

The controller 190' may control the transfer unit 110, the rotation driving part 130, the contaminant removal unit 150', and the water drain valve 174. The controller 190' may also control the rinsing apparatus 200 and the drying apparatus 300.

The controller 190' may receive the water level information I1 from the water level gauge sensor 161. The controller 190' may receive the height information I3 of the first contact cleaning surface 121a from the height measuring sensor 163.

In some embodiments, the controller 190' may control the rotation driving part 130 using the height information I3 and the predetermined reference height Hs. For example, when the first contact cleaning surface 121a is positioned below the reference height Hs, the controller 190' may control the rotation driving part 130 so as to rotate the porous suction part 120' at a predetermined angle (e.g., about 45°). The semiconductor devices SD may then be in contact with the second cleaning surface 121b instead of the first contact cleaning surface 121a.

According to exemplary embodiments, contaminants may be removed from a mold side of the semiconductor devices by a rotating polygonally-shaped sponge, so the semiconductor devices are in a linear surface contact with the polygonally-shaped sponge, thereby increasing contaminant removal efficiency, e.g., as compared to contact with a spherical surface of a sponge. Therefore, it may be possible to prevent the semiconductor devices from whitening on the mold side thereof. Further, the semiconductor devices may be dried so that substantially no stains may be left on the semiconductor devices. As the contaminants and stains are substantially removed from the semiconductor devices, appearance quality may improve and defects may be reduced in the resultant semiconductor devices. Further, the porous suction part may have an increased lifetime due to its rotation and polygonal pillar shape.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate cleaning apparatus, comprising:
   a porous suction part having a polygonal pillar shape with a plurality of cleaning surfaces;
   a transfer unit to transfer a substrate with a plurality of semiconductor devices toward the porous suction part, and to contact the semiconductor devices with one of the plurality of cleaning surfaces; and
   a rotation driving part to rotate the porous suction part.

2. The substrate cleaning apparatus as claimed in claim 1, wherein:
   the plurality of cleaning surfaces of the porous suction part are flat, and
   the transfer unit reciprocally moves the substrate parallel to the one of the cleaning surfaces, while the semiconductor devices are in contact with the one of the cleaning surfaces.

3. The substrate cleaning apparatus as claimed in claim 1, further comprising a water tub that accommodates a cleaning water, at least a portion of the porous suction part being in the cleaning water.

4. The substrate cleaning apparatus as claimed in claim 3, further comprising a water level gauge sensor to sense a water level of the cleaning water in the water tub.

5. The substrate cleaning apparatus as claimed in claim 3, further comprising:
   a feed pipe to provide the cleaning water to the water tub; and
   a drain pipe to drain the cleaning water out of the water tub.

6. The substrate cleaning apparatus as claimed in claim 3, further comprising a contaminant removal unit to provide vibration to the cleaning water and to remove contaminants from the porous suction part in the cleaning water.

7. The substrate cleaning apparatus as claimed in claim 6, wherein the contaminant removal unit includes an ultrasonic vibrator.

8. The substrate cleaning apparatus as claimed in claim 3, wherein the cleaning water includes deionized water.

9. The substrate cleaning apparatus as claimed in claim 1, further comprising a contaminant removal unit to provide vibration to at least one of the cleaning surfaces which are not in contact with the semiconductor devices and to remove contaminant from the porous suction part.

10. The substrate cleaning apparatus as claimed in claim 1, further comprising a water feed pipe inside the porous suction part, the water feed pipe including a plurality of discharge holes to discharge cleaning water flowing inside the water feed pipe.

11. The substrate cleaning apparatus as claimed in claim 1, wherein the porous suction part includes a sponge.

12. The substrate cleaning apparatus as claimed in claim 1, further comprising a controller to control the rotation driving part so as to periodically rotate the porous suction part at a predetermined angle.

13. The substrate cleaning apparatus as claimed in claim 1, wherein the transfer unit is to contact the semiconductor devices on the substrate with one or more of the plurality of cleaning surfaces.

14. The substrate cleaning apparatus as claimed in claim 13, wherein the plurality of cleaning surfaces are flat, a surface contact between each semiconductor device and a corresponding cleaning surface being linear.

15. The substrate cleaning apparatus as claimed in claim 13, wherein the porous suction part is periodically rotatable.

16. The substrate cleaning apparatus as claimed in claim 13, wherein the porous suction part is a sponge, and a water feed with a plurality of discharge holes extends through the sponge.

17. The substrate cleaning apparatus as claimed in claim 13, wherein the transfer unit is movable parallel to the one of the cleaning surfaces, while the semiconductor devices are in contact with the one of the cleaning surfaces.

18. A substrate processing system, comprising:
   a substrate cleaning apparatus to remove contaminants from semiconductor devices on a substrate; and
   a drying apparatus to dry the substrate after the substrate cleaning substrate,
   wherein the substrate cleaning apparatus includes:
      a porous suction part having a polygonal pillar shape with a plurality of cleaning surfaces,
      a transfer unit to transfer a substrate with a plurality of semiconductor devices toward the porous suction part, and to contact the semiconductor devices with one of the plurality of cleaning surfaces, and
      a rotation driving part to rotate the porous suction part.

19. The substrate processing system as claimed in claim 18, further comprising:
   a detergent injection unit to inject a detergent solution toward the substrate after the substrate cleaning apparatus; and
   a wash injection unit to inject a washing solution toward the substrate after the detergent injection unit.

20. The substrate processing system as claimed in claim 18, wherein the substrate cleaning apparatus further comprises a controller to control the rotation driving part so as to periodically rotate the porous suction part at a predetermined angle.

* * * * *